United States Patent
Liao

(10) Patent No.: US 7,682,165 B2
(45) Date of Patent: Mar. 23, 2010

(54) ELECTRICAL CONTACT WITH RETAINING DEVICE FOR CLIPPING SOLDER BALL

(75) Inventor: Fang-Chu Liao, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/286,357

(22) Filed: Sep. 29, 2008

(65) Prior Publication Data

US 2009/0088016 A1  Apr. 2, 2009

(30) Foreign Application Priority Data

Sep. 29, 2007  (CN) .................... 2007 2 0044337 U

(51) Int. Cl.
*H01R 12/00* (2006.01)
(52) U.S. Cl. ......................... 439/83; 439/342
(58) Field of Classification Search ................ 439/70, 439/71, 72, 342, 876, 83, 259–266
See application file for complete search history.

(56) References Cited

U.S. PATENT DOCUMENTS

| 5,984,694 | A  | * | 11/1999 | Sinclair ........................ 439/70 |
| 6,501,665 | B1 | * | 12/2002 | Ted ............................. 361/808 |
| 6,533,590 | B1 | * | 3/2003  | Lee et al. ....................... 439/83 |
| 6,755,667 | B2 | * | 6/2004  | Lin ............................... 439/83 |
| 6,843,662 | B2 | * | 1/2005  | Ju ................................ 439/83 |
| 7,074,055 | B2 | * | 7/2006  | Yang et al. ..................... 439/83 |
| 2007/0249240 | A1 |  | 10/2007 | Chiang |

* cited by examiner

*Primary Examiner*—Thanh-Tam T Le
(74) *Attorney, Agent, or Firm*—Andrew C. Cheng; Wei Te Chung; Ming Chieh Chang

(57) ABSTRACT

An electrical contact (10) using for electrically connecting a chip module to a printed circuit board includes a base portion (101), an arm portion (102) extending from side of the base portion (101), a retaining device (104) extending downwardly from the base portion (101) for retaining a soldering ball (20). The retaining device further comprises a plurality of clipping portions, said clipping portions forming a retaining space (1044) for receiving the soldering ball jointly, and at least one of said clipping portions defining a guiding surface (1046) and a recess (1045). By above way, steady attachment between the soldering ball and the contact is achieved.

5 Claims, 4 Drawing Sheets

US 7,682,165 B2

ELECTRICAL CONTACT WITH RETAINING DEVICE FOR CLIPPING SOLDER BALL

BACKGROUND OF THE INVENTION

1. Field of the Invention

The present invention relates to an electrical contact for connecting a chip module and a printed circuit board.

2. Description of the Prior Art

Electrical contact, which connects with other electric component by soldering art, generally comprises a base portion, a first contacting portion extending from one end of the base portion for engaging with a chip module and a solder portion extending from another end of the base portion for electrically and mechanically connecting with a PCB by the soldering art. The solder portion generally comprises a soldering board of a plate like shape. Before the solder portion is soldered to the PCB, a solder ball is attached to a bottom surface of the solder portion. Then, the electrical contact will be soldered onto the PCB after a reflow process.

US patent application publication No. 2007/0249240 issued to Chiang on Oct. 25, 2007 disclosed an electrical contact, comprising a clipping device and a stopping portion. The clipping device comprises a first clipping portion and a second clipping portion. A containing space is formed between the first clipping portion and the second clipping portion. The stopping portion is connected with the first retaining portion and curved and extended inwardly to the containing space and is vertical to the first clipping portion. Solder balls are clipped reliably in a space surround between a bottom end of the first clipping portion and a bottom end of the second portion and the stopping portion, without reflowing the solder balls to the contacts. Thereby, the cost of the reflow process is reduced.

However, there are some issues existing in the Chiang's art. It is inconveniently for the solder portion to be seated into the containing space and attachment between the solder balls and the first clipping portion, the second clipping portion and the stopping portion are unsteadily.

Thus, there is a need to provide a new electrical contact that overcomes the above-mentioned problem.

SUMMARY OF THE INVENTION

Accordingly, an object of the present invention is to provide an electrical contact having a retaining device for improving stability of the clipping and convenient for embedding the soldering ball into the containing space.

To fulfill the above-mentioned object, an electrical contact using for electrically connecting a chip module to a printed circuit board includes a base portion, an arm portion extending from side of the base portion, a retaining device extending downwardly from the base portion for retaining a soldering ball. The retaining device further comprises a plurality of clipping portions, said clipping portions forming a retaining space for receiving the soldering ball jointly, and at least one of said clipping portions defining a guiding surface and a recess. By above way, steady attachment between the soldering ball and the contact is achieved.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
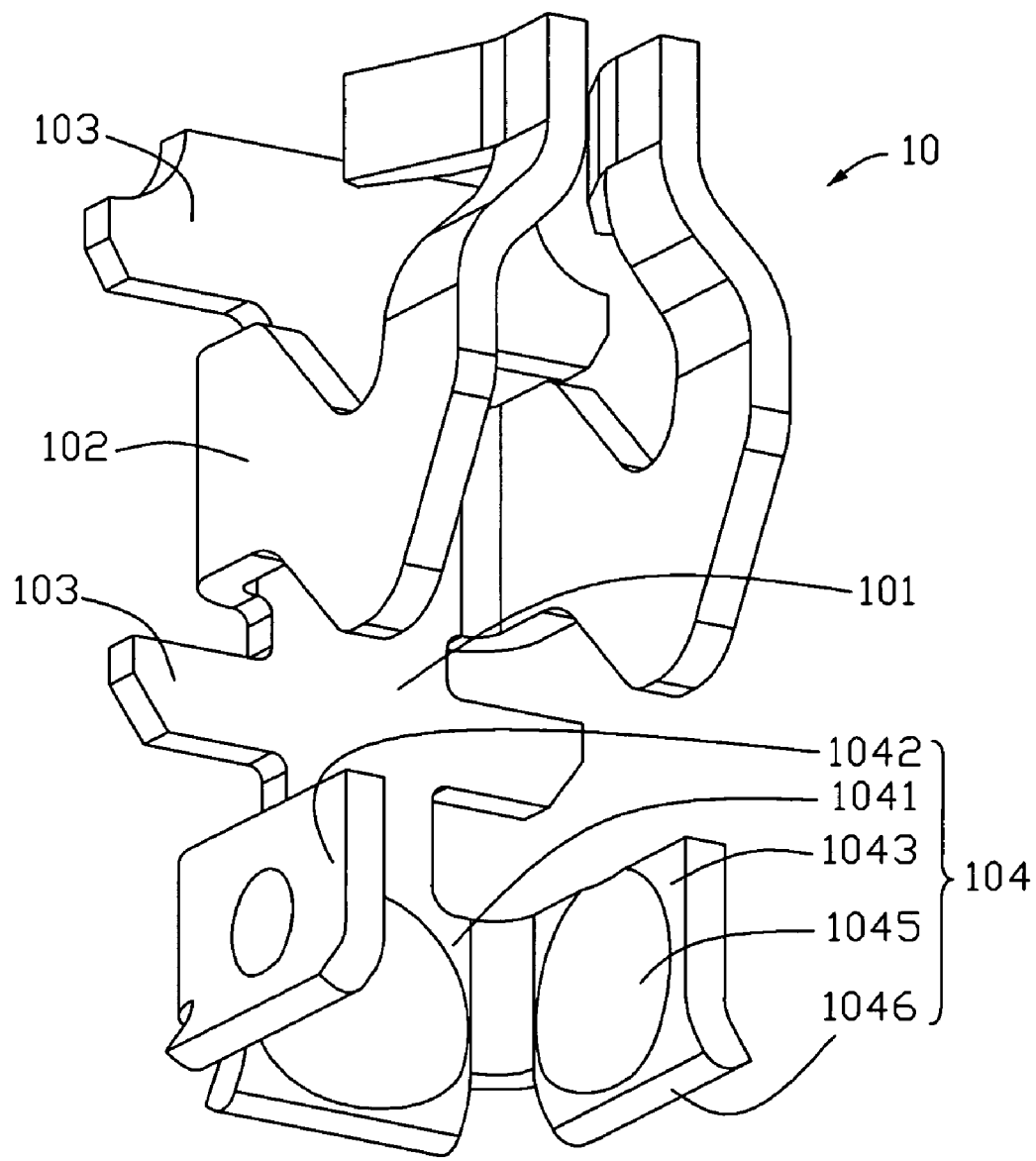
FIG. 1 is a perspective view of an electrical contact according to an embodiment of the present invention.

The electrical contact 10 is shown in FIG. 1, which can be used for connecting a chip module (not shown) and a printed circuit board (PCB). The electrical contact 10 comprises a base portion 101, a pair of arm portions 102 extending upwardly from the side of the base portion 101, a retaining portion 103 arranged on sides of the base portion 101 and a retaining device 104 for clamping a soldering ball 20 extending downwardly from the base portion 101.

The base portion 101 is generally of a plate like shape. The downwardly retaining device 104 further comprises a first clipping portion 1041 extending downwardly from the base portion 101 and connecting with the base portion 101, a second clipping portion 1042 extending from two sides of the first clipping portion 1041 and is perpendicular to the first clipping portion 1041, a third clipping portion 1043 and a containing space 1044 (see FIG. 2) between the clipping portions. The first clipping portion 1041, the second clipping portion 1042 and the third clipping portion 1043 each define a recess 1045 and a guiding surface 1046 and the recess 1045 is shaped in compliance with surface of the soldering ball 20.

Figure 2:
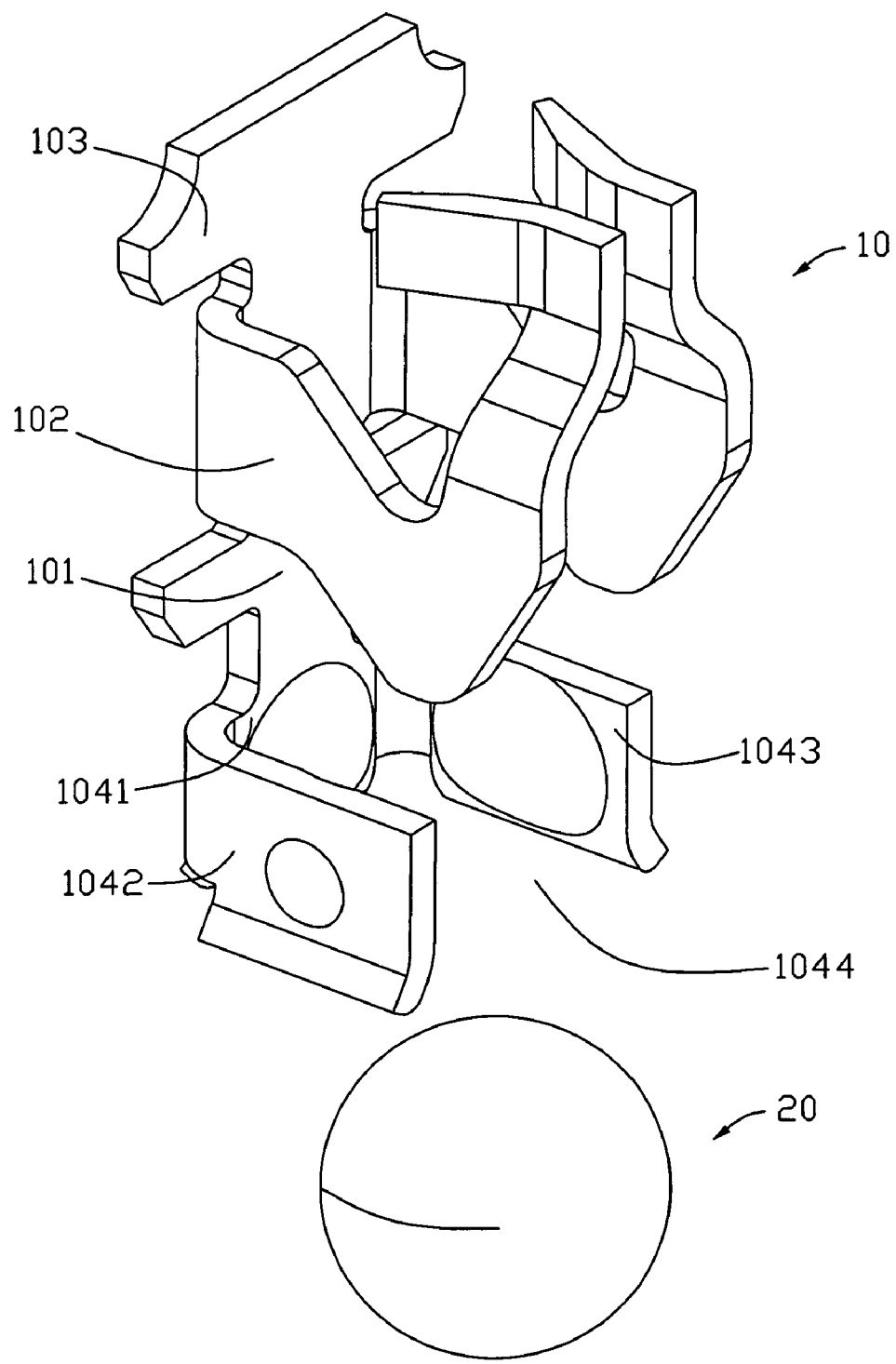
FIG. 2 is a perspective view of a solder ball not installed in the containing space of the contact according to an embodiment of the present invention.
Figure 3:
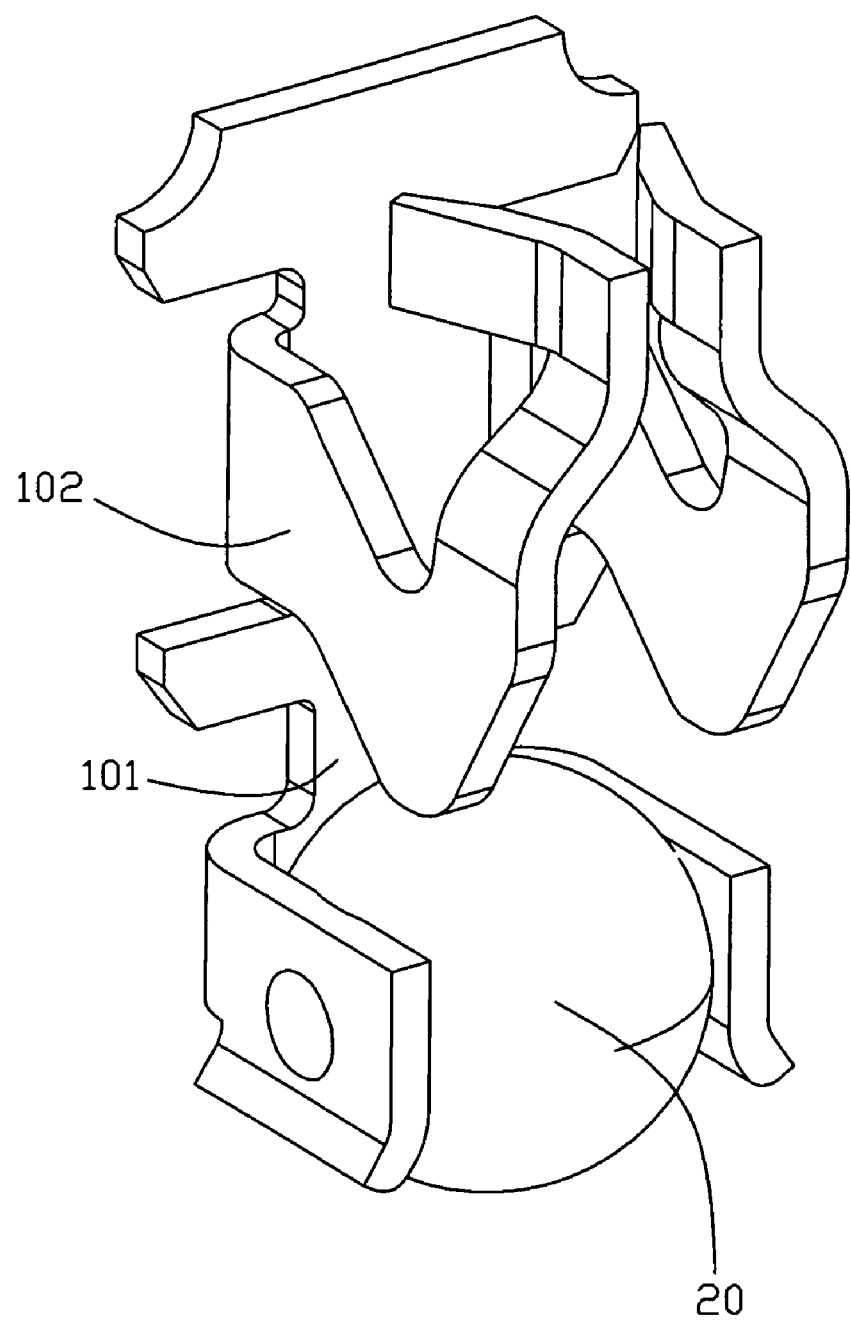
FIG. 3 is a perspective view of a solder ball installed in the containing space of the contact according to an embodiment of the present invention.

A process of embedding the soldering ball 20 within the containing space 1044 of the retaining device 104 of the electrical contact 10 is shown in FIGS. 2-3. Partial portion of the soldering ball 20 is located within the recess 1045 after the soldering ball 20 embedded. Thereby, the soldering ball 20 is clipped steady by the first clipping portion 1041, the second clipping portion 1042 and the third clipping portion 1043.

Figure 4:
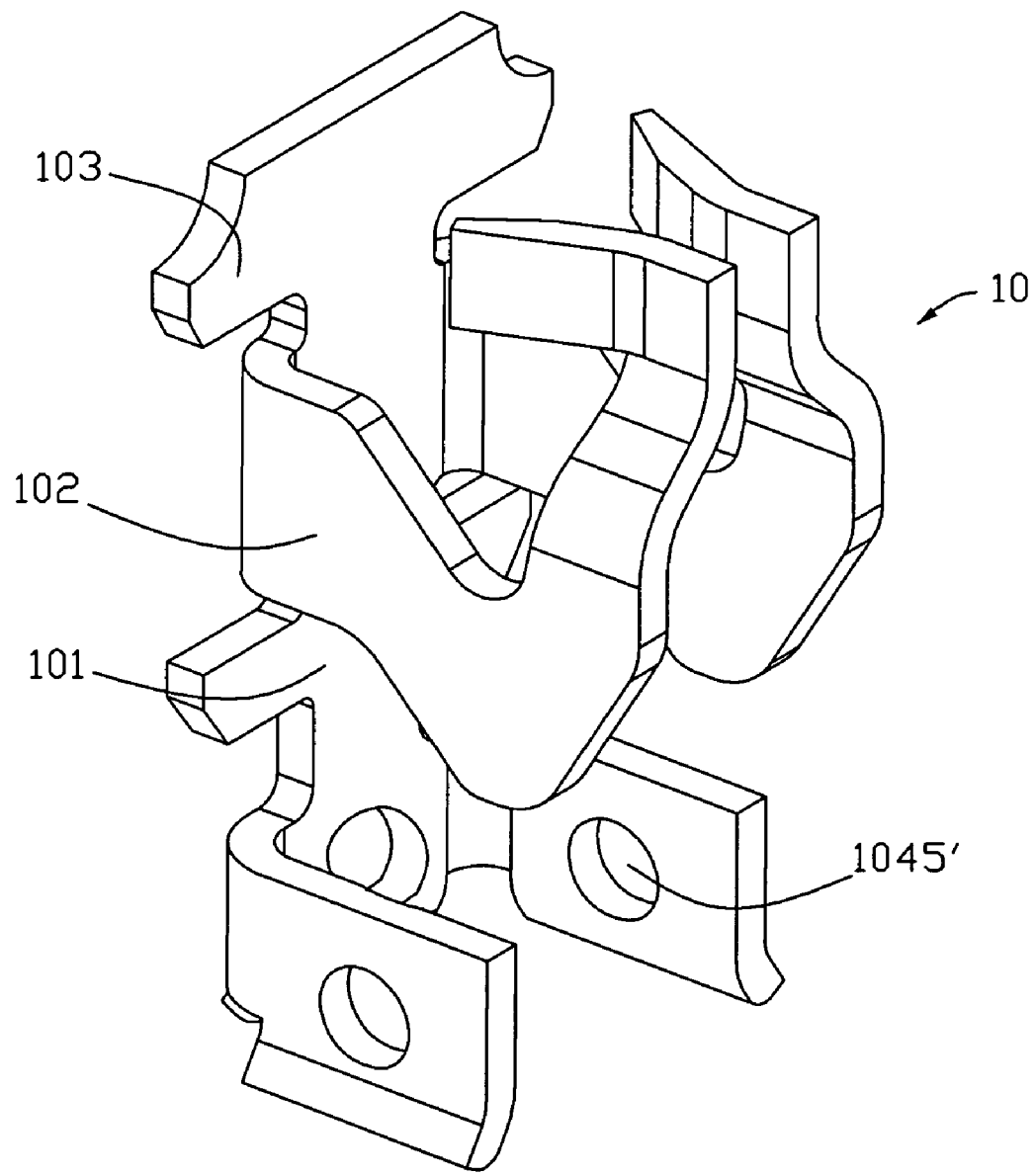
FIG. 4 is a perspective view of an electrical contact according to another embodiment of the present invention.

FIG. 4 shows a second embodiment according to the present invention. As an alternative, through holes 1045' extend through the first clipping portion 1041, the second clipping portion 1042 and the third clipping portion 1043 respectively instated of the recess 1045 of the first embodiment. Steady attachment between the clipping portions and the soldering ball 20 is also achieved.

In the present invention, the first clipping portion 1041, the second clipping portion 1042 and the third clipping portion 1043 each define a guiding surface 1046 convenient for embedding the soldering ball 20 and a recess 1045/through hole 1045'. It is needed to note that, as long as one of the first clipping portion 1041, the second clipping portion 1042 and the third clipping portion 1043 has a guiding surface 1046 convenient for embedding the soldering ball 20 and a recess 1045/through hole 1045', steady attachment between the clipping portions and the soldering ball 20 may be achieved.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical contact, comprising:
a base portion;

an arm portion extending from the base portion; and a retaining device extending downwardly from the base portion for retaining a soldering ball;

wherein the retaining device further comprises a plurality of clipping portions, said clipping portions forming a retaining space for receiving the soldering ball jointly, and at least one of said clipping portions defining a guiding surface and a recess; and wherein the plurality of clipping portions comprises a first clipping portion extending downwardly from the base portion and connecting with the base portion, a second clipping portion, and a third clipping portion extending from two sides of the first clipping portion, respectively and vertical to the first clipping portion;

wherein the first clipping portion, the second clipping portion and the third clipping portion each define a recess.

2. The electrical contact as claimed in claim 1, wherein the recess is shaped in compliance with surface of the soldering ball.

3. An electrical contact, comprising:

a base portion;

an arm portion extending from side of the base portion; and a retaining device extending downwardly from the base portion for retaining a soldering ball;

the retaining device further comprising a plurality of clipping portions, said clipping portions forming a retaining space for receiving the soldering ball jointly, and at least one of said clipping portions defining a guiding surface and a through hole extending therethrough; and wherein the plurality of clipping portions comprises a first clipping portion extending downwardly from the base portion and connecting with the base portion, a second clipping portion, and a third clipping portion extending from two sides of the first clipping portion, respectively and vertical to the first clipping portion;

wherein the first clipping portion, the second clipping portion and the third clipping portion each define a through hole.

4. A contact for use with an electrical connector, comprising:

a planar retention section extending in a vertical plane;

a contacting section located above said retention section, said contacting section including a pair of opposite spring arms extending from two opposite sides of said vertical plane for sandwiching a pin type electronic part therebetween; and a soldering section located below the retention section, said soldering section including a pair of opposite clipping tabs extending from said two opposite sides of the vertical plane to sandwiching a solder ball therebetween; wherein each of said clipping tabs defines a concave recess in an interior face for compliantly and intimately holding the solder ball;

wherein another recess is formed in the vertical plane at a same level with the recess in the interior face of each of said clipping tabs to compliantly engage the solder ball; and wherein the pair of opposite clipping tabs extend in a plane perpendicular to the vertical plane.

5. The contact as claimed in claim 4, wherein said pair of spring arms and said pair of clipping tabs are located on a same side with regard to said vertical plane.

\* \* \* \* \*